United States Patent
Caggiano et al.

(10) Patent No.: US 6,326,797 B2
(45) Date of Patent: *Dec. 4, 2001

(54) APPARATUS AND METHOD FOR EVALUATING PRINTED CIRCUIT BOARD ASSEMBLY MANUFACTURING PROCESSES

(75) Inventors: Ray J. Caggiano, Charlotte; Boyd H. Furr, Albemarle; Jeff A. Hatley, Mebane; Richard Joseph Noreika, Davidson, all of NC (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/034,404

(22) Filed: Mar. 4, 1998

(51) Int. Cl.⁷ .................................................. G01R 27/08
(52) U.S. Cl. ...................... 324/719; 324/158.1; 324/754; 361/777; 257/48
(58) Field of Search .............................. 324/158.1, 754, 324/719; 228/103, 104; 136/230; 361/777; 257/48

(56) References Cited

U.S. PATENT DOCUMENTS

| | | | |
|---|---|---|---|
| 4,443,756 | * 4/1984 | Lighbody et al. | 324/761 |
| 4,573,009 | * 2/1986 | Fowler et al. | 324/761 |
| 5,180,440 | * 1/1993 | Siegel et al. | 136/230 |
| 5,216,358 | 6/1993 | Vacher | 324/158 P |
| 5,256,975 | 10/1993 | Mellitz et al. | 324/519 |
| 5,400,221 | 3/1995 | Kawaguchi | 361/771 |
| 5,509,598 | * 4/1996 | Nayar et al. | 228/180.1 |
| 5,511,306 | * 4/1996 | Denton et al. | 29/840 |
| 5,548,223 | * 8/1996 | Cole et al. | 324/754 |
| 5,564,183 | 10/1996 | Satou et al. | 29/840 |
| 5,574,382 | 11/1996 | Kimura | 324/754 |
| 5,654,646 | 8/1997 | Kit | 324/754 |

* cited by examiner

Primary Examiner—Safet Metjahic
Assistant Examiner—Jimmy Nguyen
(74) Attorney, Agent, or Firm—Connolly Bove Lodge & Hutz

(57) ABSTRACT

A test coupon for measuring the effects of solder processes on circuit testability. The test coupon includes a circuit board having a multiplicity of circuit conductor patterns. Each conductor pattern is connected to a plurality of pads and vias on the circuit board. The circuit pads on an opposite surface of the circuit board support solder connections to a plurality of different circuit components. The circuit pads are connected to the vias, which in turn are connected to individual conductors of the circuit pattern. A surface connector is also supported on the circuit board, having pins extending through the circuit board. The circuit pattern conductors terminate on a respective connector pin. The test coupon may be subject to in-circuit testing where a value of the various components are measured. The multiple circuit patterns and mounted components permit different types of tester pins to be used to evaluate in-circuit testability in a test coupon used in a particular manufacturing process.

5 Claims, 3 Drawing Sheets

APPARATUS AND METHOD FOR EVALUATING PRINTED CIRCUIT BOARD ASSEMBLY MANUFACTURING PROCESSES

BACKGROUND OF THE INVENTION

The present invention is directed to an apparatus and method which is used to evaluate the effect of solder substances on a printed circuit board populated with electronic components. Specifically, a test circuit board assembly is disclosed which when subject to a solder process, is useful for measuring the effects of the soldering process on circuit testability.

The processes for manufacturing printed circuit boards having mounted components interconnected by circuit conductors influences the circuit board test ability following manufacture. When changes to printed circuit board manufacturing assembly processes occur, such as changing fluxes and solder pastes which may require water cleaning of the circuit board, to fluxes and solder pastes which are designed not to be cleaned from the circuit board, the ability to test the circuit board assembly by conventional product testing facilities changes. While the changes to the processes may in fact not effect the circuit operation, the ability to test the circuit board assembly may be impaired.

Testing of completed circuit board assemblies conventionally requires a set of probes which are applied to the circuit conductors on the circuit board. The probes are of different design, and some may for a given solder processes, provide a better connection to a circuit board concuctor than others. Processes which involve the use of so-called no-clean fluxes and solder pastes, which are not to be removed from the printed circuit board, may pose a problem for testing the final product. While the residue from the no-clean flux and solder paste is not detrimental to product performance, the probes from a tester may not adequately make contact with the circuit board conductor when covered by a residue.

Because of the wide availability of different types of clean and no-clean fluxes and solder pastes, it is desirable to provide a common test vehicle which can evaluate the impact on testability for the use of any of these fluxes and solder pastes, and processes for soldering circuit board assemblies with these fluxes and solder pastes.

The testability of a circuit board assembly depends on the particular types of components being soldered to the surface of a board. Thus, while one component type may show no effects on testability after the use of a new no-clean flux and solder paste, other components may in fact make testability very difficult and unreliable.

The present invention provides a way for evaluating these processes prior to committing to any significant production of circuit boards.

SUMMARY OF THE INVENTION

It is an object of this invention to provide evaluation of in-circuit testability of a printed circuit board assembly.

It is a specific object of this invention to provide for in-circuit test evaluation of assembled circuit boards made in a particular manufacturing process using different types of circuit testing probes.

These and other objects in accordance with the invention are provided by a test coupon which is subject to solder processes. The test coupon includes multiple conductor patterns, terminating on a connector pin as well as at least one via hole and a circuit pad. Circuit components are soldered to pads on the multiple circuit patterns by a solder process. The selected components, as well as the via and circuit pads, represent typical circuit board structures which are soldered in a manufacturing process.

The resulting test coupon is subject to completed printed circuit board assembly testing. The test coupon having the mounted components is placed in an in-circuit tester where connections are made to the vias and pads of the circuit card by probes of the in-circuit tester. Electrical measurements including continuity measurements and component value measurements are made through the probes to verify the circuit testability. An accurate assessment of the manufacturing environment may be made without jeopardizing production hardware in an unqualified manufacturing process.

The multiple quadrants of the test coupon provide the ability to simultaneously test different probe types to determine whether or not the manufacturing processes affect the ability of a given probe type to connect to a respective conductor, pad, pin or via, on a circuit board.

DESCRIPTION OF THE PREFERRED EMBODIMENT

Figure 1:
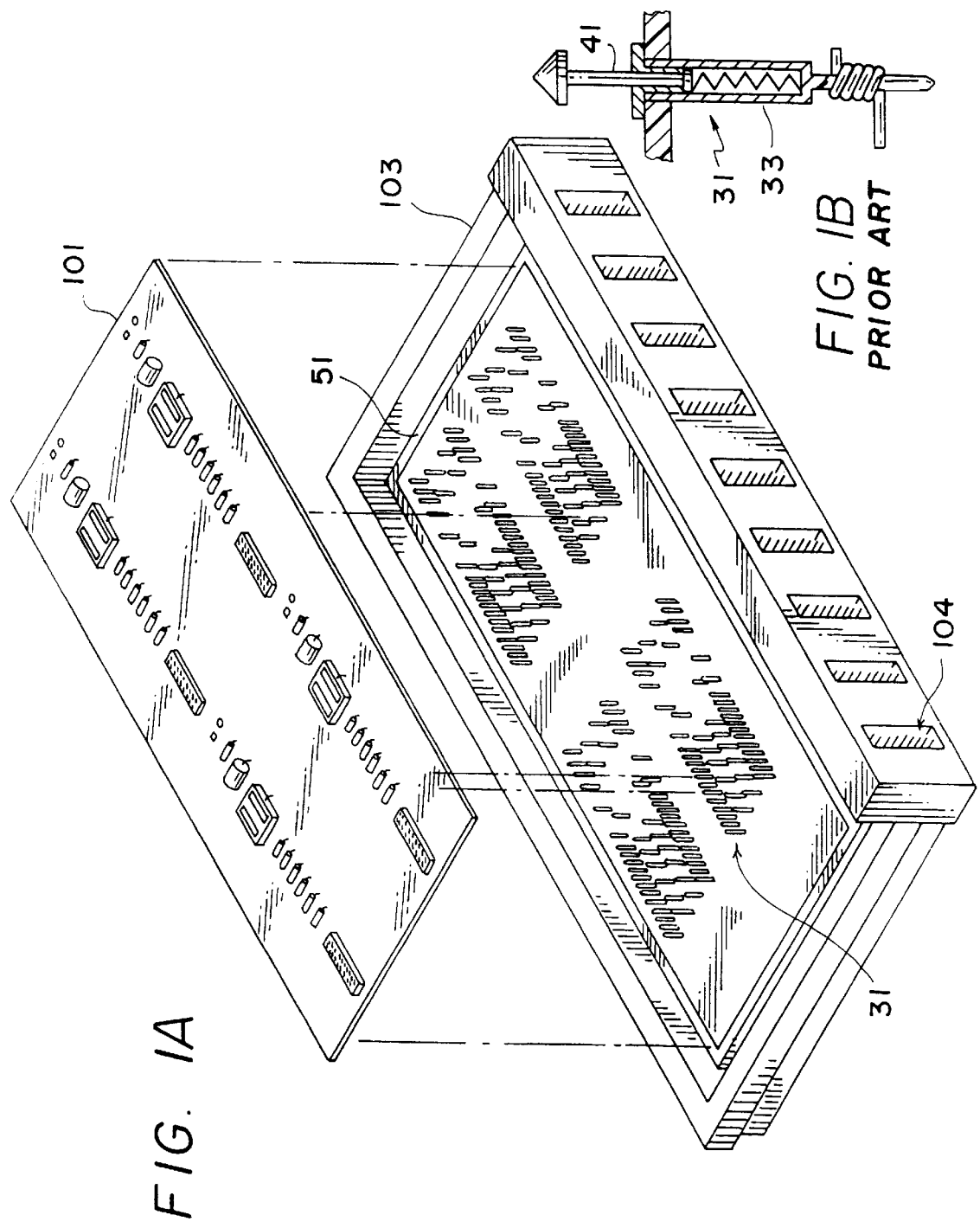
FIG. 1A shows a testing device for testing assembled circuit boards.
FIG. 1B shows the detail of a test probe 31.

FIG. 1A shows a test coupon 101 in accordance with the present invention located in a testing unit 103. The test coupon 101 is received within a test bed 51, and held in place by a vacuum. The vacuum supplied from a vacuum line connected to the testing unit 103 maintains a positive connection between a plurality of spring-loaded probes 31 supported in the test bed 51 and conductor portions of the test coupon. The spring-loaded probes 31, shown in FIG. 1B, include a probe end 41, having a generally conically-shaped tip spring-loaded in a cylinder 33. Once the coupon 101 is loaded into the test bed 51, the probes 31 connect to various circuit pads, circuit vias and pins which are on the underside of the test coupon 101.

The circuit testing unit 103 connects via connectors 104 to a test station which measures various electrical parameters between each of the probes 31. In accordance with the preferred embodiment of the test coupon, a pair of probes connects to every pad and every via on the test coupon. In this way component values may be directly measured which identifies any failed solder connections, incorrect component values, and any circuit resistance between the probes 31 and the various pads and vias of the test coupon circuit board.

In-circuit measurements through the probes 31 are directly influenced by the processes used to solder components to the circuit board. For instance, when using so-called "no-clean" fluxes and solder pastes, after a solder reflow, they often leave a residue on the conductors of the printed circuit board. The residue material is insulative so that it does not affect the circuitry by shorting electrical conductors. While the residue is not per se detrimental, it can interfere with the ability to conduct in-circuit testing by interfering with the electrical contact between the probes and the surface conductor.

Figure 2:
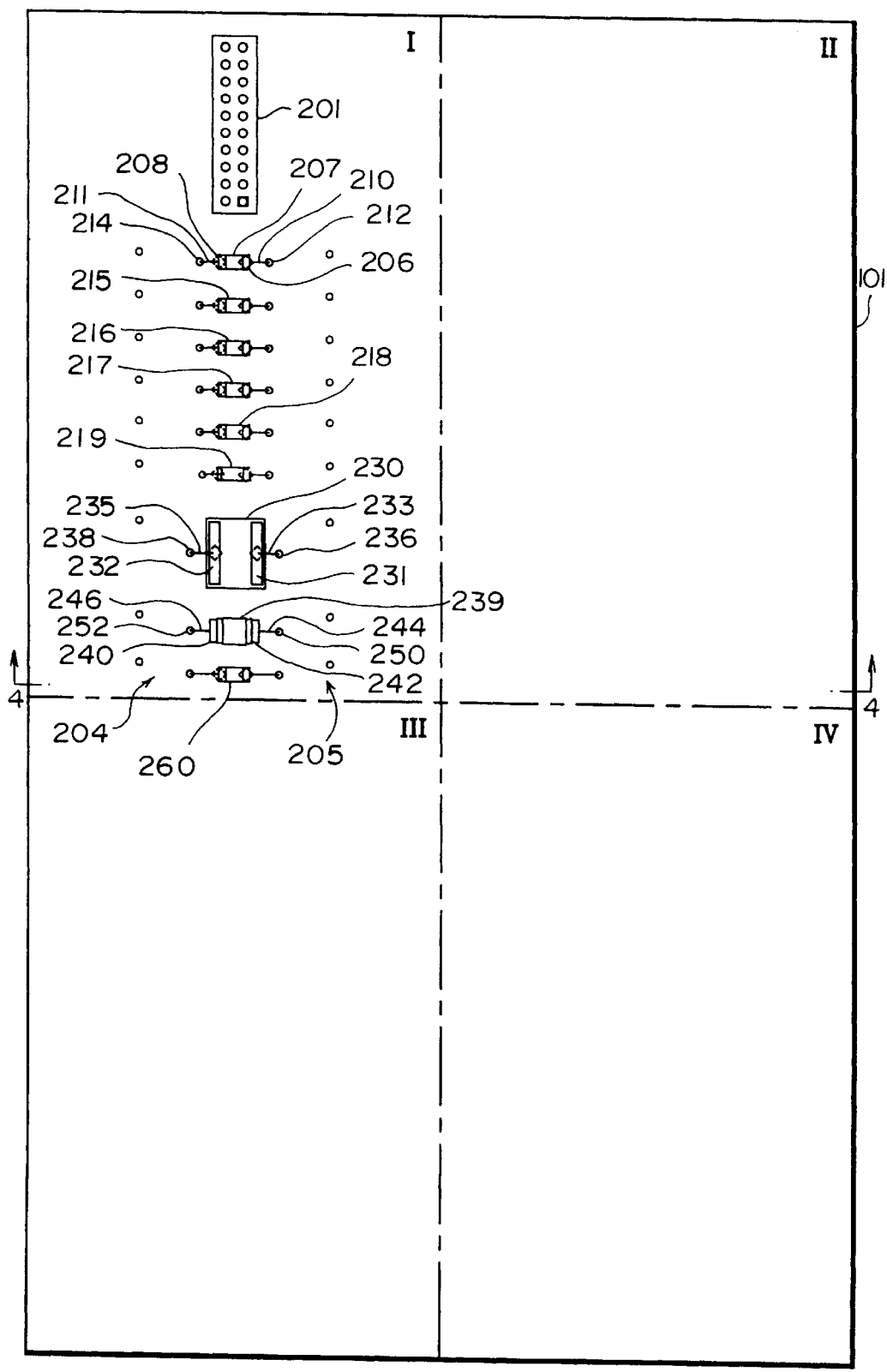
FIG. 2 represents the top view of a quadrant of a test coupon in accordance with a preferred embodiment of the invention.
Figure 4:
FIG. 4 is a section view of two quadrants of the test coupon.

The present invention provides the opportunity to measure the effects of these processes on circuit testability. Referring now to FIG. 2 and FIG. 4, a top view and section view of a printed circuit board test coupon 101 is shown which will permit the evaluation of these processes on circuit testability. The printed circuit board test coupon 101 is divided into four quadrants having the same component and circuit structure (shown only in quadrant I). When the test coupon is manufactured using a particular soldering process, each quadrant may be tested with a different probe configuration to determine the individual effects of the process on different probe styles of a testing unit.

Figure 3:
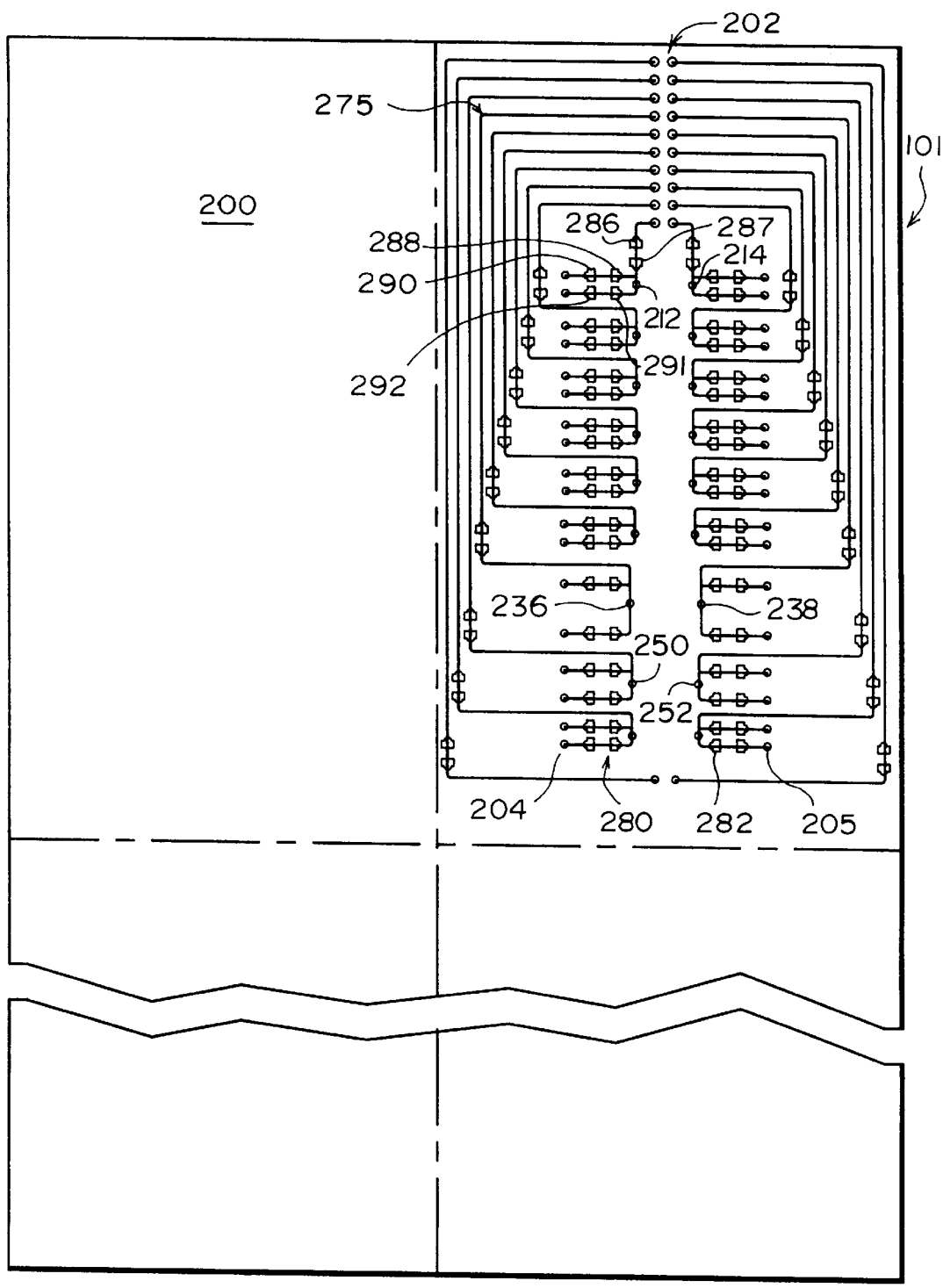
FIG. 3 represents the bottom view of a quadrant of the test coupon of FIG. 2.

Quadrant I, which is identical to the remaining quadrants, II, III and IV, includes a connector 201 having a plurality of pins 202 extending through the circuit board 200. The pins are wave soldered on the underside of the circuit board 200, and as will be evident with respect to FIG. 3, are interconnected to various pads and vias of the circuit board.

Two columns of via holes 204 and 205 are provided on each quadrant of the circuit board 200. The via holes are connected from the top surface represented in FIG. 2 to the bottom surface of FIG. 3. The via holes represent plated-through connections, from one side of the test coupon 200 to the other, which are typical in printed circuit board construction.

A column of resistors 207, 215, and 216, and a column of capacitors 217, 218 and 219 are surface mounted on the test coupon 200. The surface mounted resistors and capacitors are chosen to have different values, permitting the opportunity to examine solder effects on circuit testability where a variety of component values are implemented. A plurality of pads, two of which are shown as 206 and 208 on the surface of test coupon circuit board 200, are soldered to connections on the individual resistors 207, 215 and 216. Each of the pads is connected by a circuit conductor 210 and 211 to a via of the column of vias 212 and 211. The column of vias 212 and 214, through conductors 210 and 211, connect the ends of the resistors to circuit conductors on the underside of test coupon 200.

The additional components surface mounted to circuit board 200 includes inductors 230 and 239, each having a different inductance. The inductors 230, 239 are also surface mounted, typically with a solder process to respective pads 231, 232, and 242, 240 on the surface of the coupon 200. The laterally extending conductors 233, 235, and 244 and 246, connect the ends of the inductors 230, 239 to a pair of vias, 236, 238 and 252 and 250. With different values of inductors, in circuit testing equipment applies probes to points on the circuit board conductors which are connected to vias 236, 238 and 250 and 252 to directly measure the values of these components. The resulting measurements indicate the quality of contact between the test probes and the circuit board conductors which has been subject to a particular manufacturing process.

Additional resistor 260 and a jumper (not shown) are also soldered to the surface of the board. A pair of vias carry the ends of resistor 260 to the underside of the board.

Referring now to FIG. 3, which illustrates the bottom of one quadrant of a test coupon, various vias and pads are shown on the circuit board. Further, the pins 202 from the connector 201 are shown, connected to various circuit of conductor pattern 275 on the bottom of the test coupon circuit board 200. The remaining quadrants of the test coupon have identical circuit conductor patterns formed thereon.

Each of the conductors of the conductor pattern 275 terminates on a pin 202 of the connector 201. The connector pins 202 are wave soldered in place, as distinguished from the reflow or wave soldering of the surface mounted components. Each of the conductors of the conductor pattern 275 is connected to a series of pads 286–292. Further, the column of vias 212, 214, as well as the columns of vias 204, 205 on the top side of the circuit board, are connected to one of the circuit conductors of conductor pattern 275. The provision of pads 286–292 on each of the circuit conductors permits the additional mounting of surface components to the underside of test coupon circuit board 200 if they are not to be used as probe contact points.

When the test coupon 101 is loaded in the testing unit of FIG. 1A, a plurality of probes 31 have probe ends 41 that are engaged with columns of pads 280 and 282 of each conductor in conductor pattern 275 to permit a measurement of the component which is connected to the columns of vias 212 and 214. By connecting to each of the pads of the columns 280 and 282, the value of each of the circuit components may be measured. Other probes connect to the columns of vias 204, 205, and 212 and 214 to make the same measurements.

Thus, for a given probe type, the in-circuit testability is determined from measuring the values of these known components which will apply to the top surface of the circuit board. Further, a similar test is conducted by using a different probe type 31, having instead of a tapered probe end, a crown shaped probe end suitable for connecting to the pins 202 of the connector 201. Thus, it is possible to verify measurements which have been made by each of the probe types connected across the individual components. The testing unit 103 may include different probe types for each quadrant. Thus, while quadrant I may be measured with a probe which is adapted for connection to the pads of columns 280 and 282, the quadrant II may have probes connected only to the pins of connector 201.

Still other probe types may be used to evaluate the circuit assembly processes in quadrants III and IV, which bear the same circuit conductor pattern and connected components.

Thus, by using the tester configuration of FIG. 1A, it is possible to determine the effects of in-circuit testability on a test coupon, before actually using a given manufacturing process for deliverable products. The in-circuit testability will provide an indication as to whether or not there is a high resistance connection being made to the test coupon, or whether or not an open circuit may be present as the result of a manufacturing defect.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A solder process test coupon for measuring the effects of solder processes on circuit testability comprising:

multiple circuit patterns on one side of a circuit board, each of said circuit patterns including conductors which terminate on one end on a pin of a connector on said circuit board, and extend on another end thereof to at least one via and at least one circuit pad, permitting electrical measurements to be made between said pins, vias, and circuit pads, and multiple circuit components of different types mounted on all opposite side of said circuit board as said circuit pattern, said circuit components being connected to said circuit patterns by said vias by a soldering process, so that the effect of said solder process on different types of components are evaluated.

2. A solder process test coupon for measuring the effects of solder processes on circuit testability comprising:

a plurality of circuit patterns on one side of a circuit board, each circuit pattern having a plurality of pads which provide connections to test probes of a circuit tester, and vias which extend said circuit pattern to an opposite side of said circuit board;

a plurality of circuit pads on an opposite surface of said circuit board supporting solder connections on a plurality of different circuit component types, said circuit pads being connected to said circuit patterns by said vias; and a connector mounted on said opposite surface, having pins extending through said board to said one side, said connector pins being connected to said circuit patterns whereby each circuit pattern may be tested using different probe configurations to evaluate a solder process on different types of components.

3. The test coupon according to claim 2 wherein said connector pins are wave soldered to conductors of said circuit pattern.

4. The solder process test coupon according to claim 2 further comprising components of the same type having different values connected to pairs of circuit pads by a solder process which is to be evaluated, said circuit pads being connected to conductors of said circuit patterns.

5. The test coupon according to claim 2 comprising multiple components soldered to pairs of circuit pads on said circuit using said solder. process.

* * * * *